United States Patent
Ganje

(10) Patent No.: US 12,132,446 B1
(45) Date of Patent: Oct. 29, 2024

(54) SYSTEM AND METHOD FOR PHASE LOCKED LOOP (PLL) BASED REMOVAL OF MODULATED INTERFERENCE

(71) Applicant: Rockwell Collins, Inc., Cedar Rapids, IA (US)

(72) Inventor: Stephen A. Ganje, Frisco, TX (US)

(73) Assignee: Rockwell Collins, Inc., Cedar Rapids, IA (US)

(*) Notice: Subject to any disclaimer, the term of this patent is extended or adjusted under 35 U.S.C. 154(b) by 1 day.

(21) Appl. No.: 18/205,845

(22) Filed: Jun. 5, 2023

(51) Int. Cl.
*H03D 3/24* (2006.01)

(52) U.S. Cl.
CPC .................. *H03D 3/248* (2013.01)

(58) Field of Classification Search
CPC .............. H03D 3/242; H03D 3/248
See application file for complete search history.

(56) References Cited

U.S. PATENT DOCUMENTS

| | | | |
|---|---|---|---|
| 5,307,517 A | | 4/1994 | Rich |
| 5,483,372 A | * | 1/1996 | Green, Jr. ............... H04B 10/29 398/178 |
| 5,570,395 A | * | 10/1996 | Myers ................... H03L 7/07 379/406.01 |
| 8,886,150 B2 | | 11/2014 | Hou |
| 2004/0232951 A1 | * | 11/2004 | Tan ........................ H03L 7/095 327/105 |
| 2008/0063122 A1 | * | 3/2008 | Jong ...................... H04B 1/7097 375/350 |

FOREIGN PATENT DOCUMENTS

| | | |
|---|---|---|
| EP | 3193464 B1 | 9/2018 |
| GB | 2538226 B | 8/2021 |
| JP | 1981068014 A | 6/1981 |
| JP | 2010178220 A | 8/2010 |
| KR | 1019970008900 A | 2/1997 |
| KR | 1020010086533 A | 9/2001 |
| KR | 1020100010622 U | 10/2010 |
| WO | 2022228644 A1 | 11/2022 |

* cited by examiner

*Primary Examiner* — Freshteh N Aghdam
(74) *Attorney, Agent, or Firm* — Suiter Swantz IP

(57) ABSTRACT

A system and method for removing modulated interference (e.g., FSK, MSK, CW) from an input signal demodulates the input signal into a tracking bitstream via a set of phase locked loop (PLL) filters, one PLL filter for each modulated interference component (e.g., signal) known or suspected to be interfering with the input signal. Each PLL filter estimates, based on an estimated modulation frequency and center frequency associated with its target modulated interference component, a peak magnitude, phase, and updated center frequency and, based on these parameters, approximates the target interference component. Each re-created modulated interference component is subtracted from the original input signal to produce an output signal from which the known or suspected modulated interference components have been substantially removed.

18 Claims, 4 Drawing Sheets

SYSTEM AND METHOD FOR PHASE LOCKED LOOP (PLL) BASED REMOVAL OF MODULATED INTERFERENCE

GOVERNMENT SUPPORT

This technology was developed with United States government support under contract number FA8616-17-C-0005 awarded by the Electronic Systems Center, Air Force Materiel Command. The United States government has certain rights in this invention.

BACKGROUND

The radio spectrum, or the portion of the electromagnetic spectrum including most telecommunications signals (e.g., between 3 Hz and 3 THz) is associated with various types of interference which may prevent a transmitted signal from reaching its intended recipient intact. Some of this interference—for example atmospheric or Gaussian interference—may just be accepted, but other sources of interference can be isolated and eliminated. For example, continuous-wave (CW) interference may be identified and removed from a received signal, e.g., by identifying amplitude peaks ("spectral peaks") in a sequence of fast Fourier transforms (FFT). Other types of interference may be associated with a known, structured shape as well. However, modulated signals, e.g., wherein a modulation signal is encoded into a carrier wave by altering one or more properties of the carrier wave, may be difficult to easily remove from an input signal. Accordingly, an adversary may jam friendly signals by recording and playing back a friendly signal (e.g., at the original center frequency or at a shifted center frequency).

SUMMARY

In a first aspect, a signal receiver system capable of removing modulated interference from an input signal is disclosed. In embodiments, the system receives an input signal comprising of a modulated carrier wave interfered with by one or more modulated interference components, e.g., signals whose characteristics (e.g., modulation frequency) may be known to the receiver. For each interference component (e.g., each type of modulated interference known or thought to be a component of the input signal), a phase locked loop (PLL) filter demodulates the input signal into a tracking bitstream. Based on the modulation frequency and the center frequency associated with the particular modulated interference component (which may be known or estimated), the PLL filter samples the tracking bitstream to estimate its peak magnitude, phase, and update the center frequency. Each PLL filter attempts to reconstruct its associated modulated interference component by re-modulating the decoded bitstream based on the (known or estimated) modulation frequency and the estimated peak magnitude, phase, and center frequency. The interference signal estimate from each PLL filter is subtracted from the original input signal to produce an output signal from which known or suspected modulated interference has been removed.

In some embodiments, the receiver system analyzes the input signal to determine its spectral signature and estimates the center frequency of a particular modulated interference component based on the spectral signature.

In some embodiments, the modulation frequency of a particular modulated interference component is known to the receiver system, and the receiver system estimates the center frequency of the modulated interference based on the modulation frequency.

In some embodiments, a PLL filter estimates the phase and/or updates the center frequency of a particular modulated interference component by adjusting the starting center frequency.

In some embodiments, one or more PLL filters are serially connected, e.g., if their associated modulated interference components are known or suspected to overlap within the input signal.

In some embodiments, one or more PLL filters are connected in parallel, e.g., for non-overlapping modulated interference components.

In some embodiments, modulated interference components to be removed from the input signal include frequency shift keying (FSK) modulated signals.

In some embodiments, modulated interference components to be removed from the input signal include minimum shift keying (MSK) modulated signals.

In some embodiments, modulated interference components to be removed from the input signal include continuous wave (CW) modulated signals.

In a further aspect, a method for removal of modulated interference components from an input signal is also disclosed. In embodiments, the method includes receiving an input signal wherein a modulated carrier wave is interfered with by one or more modulated interference components (e.g., which may include friendly signals or other fully or partially known interference components). The method includes, for each known or suspected modulated interference component, demodulating the input signal into a tracking bitstream via a phase locked loop (PLL) filter dedicated to that interference component. The method includes determining, via each PLL filter, a modulation frequency and a starting center frequency for each modulated interference component. The method includes, via each PLL filter, sampling the tracking bitstream to estimate a peak magnitude, phase, and updated center frequency. The method includes producing an estimated (e.g., approximation of, re-creation of) modulated interference component by re-modulating the decoded bitstream based on the modulation frequency and the estimated peak magnitude, phase, and center frequency determined via each PLL. The method includes producing an output signal free of modulated interference by subtracting each re-created modulated interference component from the original input signal.

In some embodiments, the method includes estimating the starting center frequency of a modulation interference component based on a known modulation frequency.

In some embodiments, the method includes estimating the starting center frequency based on a spectral signature of the input signal determined via analysis of said signal.

In some embodiments, the method includes estimating the phase and/or updating the center frequency by adjusting the starting center frequency.

In some embodiments, one or more PLL filters are serially connected, e.g., if their associated modulated interference components are known or suspected to overlap within the input signal.

In some embodiments, one or more PLL filters are connected in parallel, e.g., for non-overlapping modulated interference components.

In some embodiments, modulated interference components to be removed from the input signal include frequency shift keying (FSK) modulated signals.

In some embodiments, modulated interference components to be removed from the input signal include minimum shift keying (MSK) modulated signals.

In some embodiments, modulated interference components to be removed from the input signal include continuous wave (CW) modulated signals.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
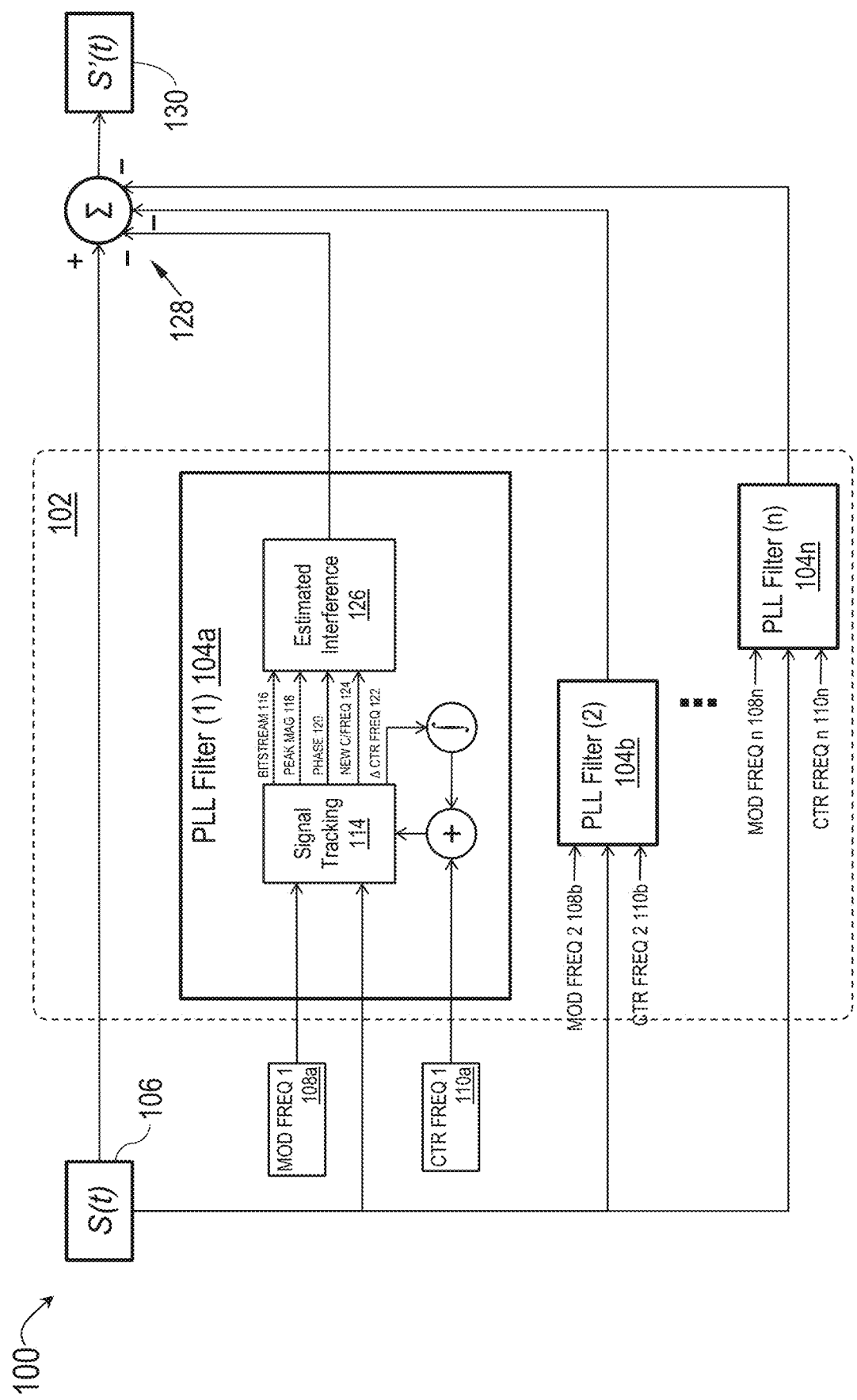
FIG. 1 is a block diagram illustrating a signal receiver with removal engine for removing modulated interference signals according to example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to systems and methods for removing modulated interference components from an input signal via phase locked loop (PLL) filters. Assuming modulated interference components of structured shape and known characteristics (e.g., center frequency, modulation frequency), the PLL filter can track and estimate characteristics of a particular interference component, re-create an interference signal and subtract the re-created, re-modulated estimate of the interference signal from the input.

Referring to FIG. 1, a signal receiver 100 incorporating a removal engine 102 is disclosed.

In embodiments, the removal engine 102 may include one or more PLL filters 104a, 104b . . . 104n connected in parallel. Further, the removal engine 102 may receive (e.g., via antenna elements, wireless or wired connections, or any appropriate means of signal reception) an input signal S(t) (106) wherein a carrier wave (e.g., carrier signal) and/or target signal (e.g., the intended encoded content of the input signal) is interfered with by one or more modulated interference components (e.g., interference signals) associated with various modulation schemes. For example, modulated interference components may include friendly signals (e.g., for which a modulation frequency and/or center frequency may be known or inferred) replayed and/or scattered in the fast Fourier transform (FFT) based frequency spectrum, such that FFT-based removal may be difficult or impossible.

For example, each PLL filter 104a-104n may be configured to remove from an input signal S(t) (106) a known modulated interference component associated with one or more of a known modulation frequency 108a-108n and a known center frequency 110a-110n. Interference components may include frequency shift-keying (FSK) modulated interference, minimum-shift keying (MSK) modulated interference, and/or standalone CW interference.

In embodiments, the removal engine 102 may include one or more processors (e.g., physical processors, virtual partitions of a multi-core processing environment) capable of estimating, for each PLL filter 104a-104n and/or its target modulated interference component, a starting or initial center frequency 110a-110n. For example, with respect to CW and/or FSK-modulated interference signals, the removal engine 102 may select a starting center frequency 110a-110n based on a known spectral signature of the input signal 106

(e.g., determined via analysis of the input signal). In some cases, e.g., MSK-modulated interference components, the starting center frequency 110a-110n may be estimated based on a known center frequency 108a-108n.

For example, based on the estimated starting center frequency 110a-110n, each PLL filter 104a-104n may incorporate signal tracking (114) by demodulating the input signal 106 into a tracking bitstream 116 and attempt to track the associated modulated interference component by sampling the tracking bitstream. For example, the PLL filter 104a-104n may attempt to estimate a peak magnitude 118, phase 120, and/or center frequency delta 122 (e.g., relative to the center frequency 110a-110n) of the target modulated interference component.

Figure 2:
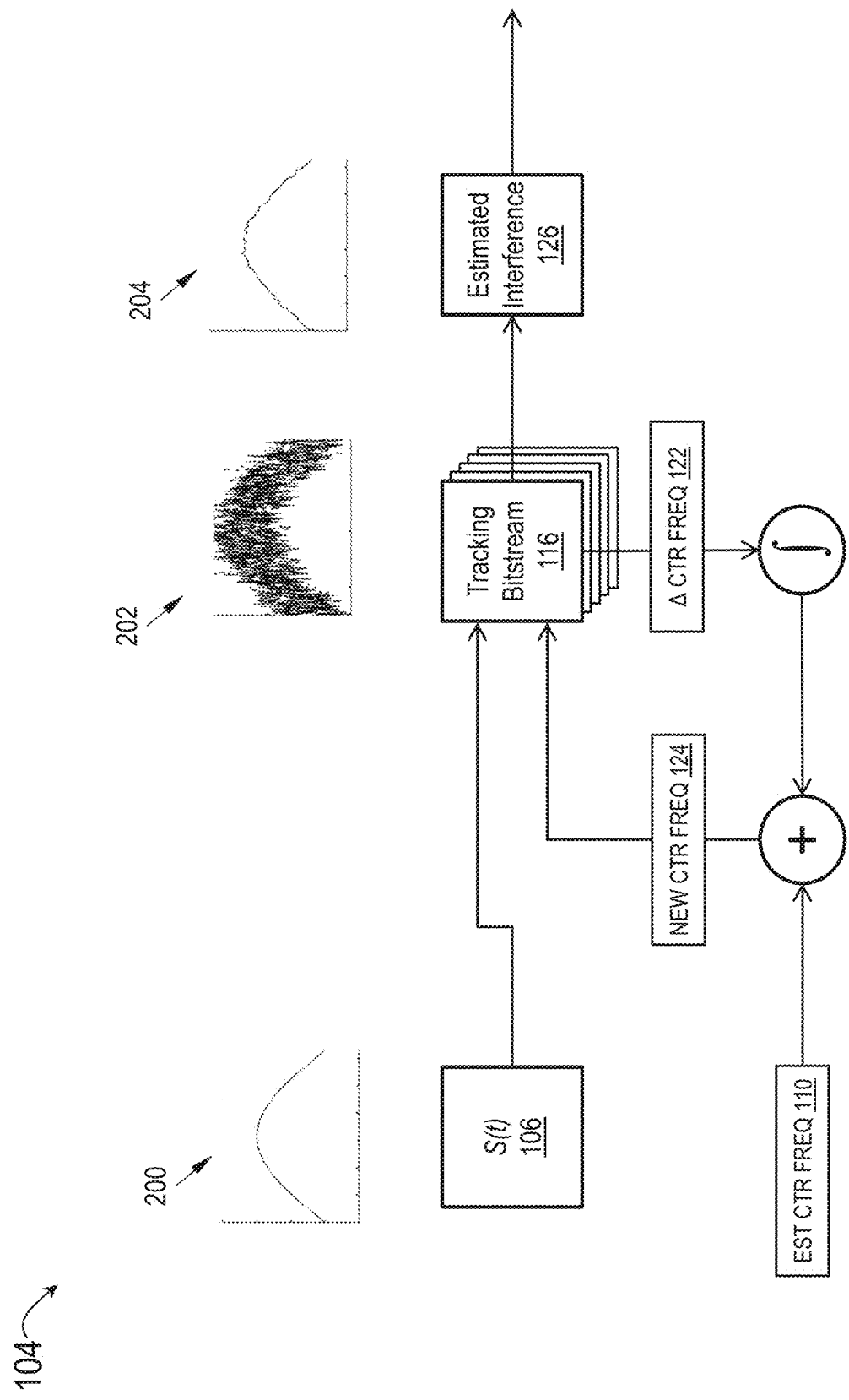
FIG. 2 is a block diagram detailing a phase locked loop (PLL) filter of the removal engine of FIG. 1, according to example embodiments of this disclosure.

In embodiments, based on signal tracking 114 of the sampled tracking bitstream 116, each PLL filter 104a may attempt to re-create its target interference signal according to the estimated peak magnitude 118, estimated phase 120, and/or estimated center frequency delta 122 (e.g., the amount by which the initial center frequency estimate 110a-110n should be adjusted, resulting in a new or updated center frequency estimate 124). For example, referring also to FIG. 2, a PLL filter 104 may be targeted to re-create for removal a particular modulated interference component 200 which may be known to the removal engine 102. Accordingly, the estimated peak magnitude 118, estimated phase 120, and estimated center frequency 110 may be highly accurate estimates closely matching the shape of the modulated interference component 200. In some embodiments, however, one or more characteristics of the modulated interference component 200 may not be known (e.g., the waveform's shape) to the removal engine 202. For example, by sampling the tracking bitstream 116, the samples may be averaged (202) to more accurately estimate the shape of the modulated interference component 200, thereby determining (if necessary) an improved shape estimate for processing. The resulting estimated interference signal 126 may more closely map (204) the modulated interference component 200.

In embodiments, the resulting estimated modulated interference signal 126 (e.g., based on the estimated peak magnitude 118, estimated phase 120, and updated center frequency estimate 124) may be subtracted (128) from the original input signal 106, along with estimations by the PLL filters 104b-104n of their own target modulated interference signals. For example, the output signal S'(t) (130) of the removal engine 102 may reflect the subtraction 128 from the input signal S(t) (106) of every modulated interference signal known or thought to be present within the input signal.

Figure 3:
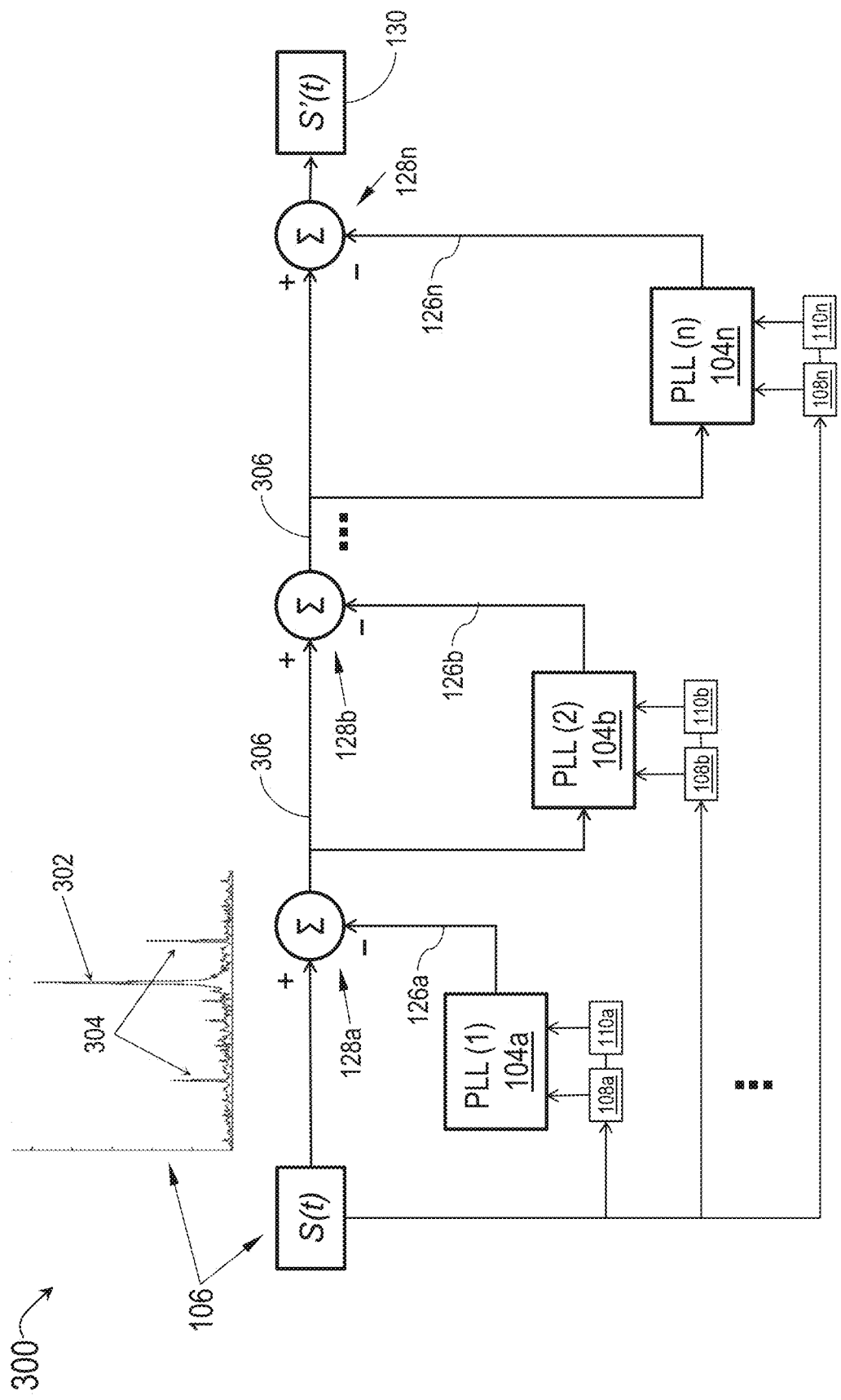
FIG. 3 is a block diagram illustrating the signal receiver of FIG. 1 in a serial, rather than parallel, configuration.

Referring to FIG. 3, the signal receiver 300 may be implemented and may function similarly to the signal receiver 100 of FIG. 1, except that with respect to the signal receiver 300, the PLL filters 104a-104n of the removal engine (102, FIG. 1) may be partially or fully arranged in a serial, rather than parallel, configuration. For example, some or all of the estimated modulated interference signals 126a-126n generated by each PLL filter 104a-104n (e.g., each estimated modulated interference signal approximating a particular modulated interference component) may be subtracted (128a-128n) from the input signal S(t) (106) serially or sequentially.

With respect to some input signals S(t) (106), the center frequencies 110a-110n and/or modulation frequencies 108a-108n of some modulated interference components may overlap to an extent, which may complicate the removal of individual modulated interference components as described above Accordingly, in some embodiments some or all of the PLL filters 104a-104n (e.g., those corresponding to modulated interference signals known or thought to interfere to some extent) may be configured serially and/or sequentially. For example, with respect to two overlapping modulated interference components, signal preprocessing may identify a first interference component having a superior signal-to-noise ratio (SNR) to a second interference component; accordingly, best results may be achieved if the PLL filters 104a-104n sequentially remove the first interference component before removing the second interference component.

In embodiments, depending on the characteristics of modulated interference components (200, FIG. 2) known or suspected to be found within the input signal S(t) (106), the removal engine (102, FIG. 1) may optimize re-creation (126a-126n) of the various modulated interference components by selecting an order in which interference components may be serially or sequentially estimated, re-created, and removed from the input signal. For example, the input signal S(t) (106) may include a relatively strong, but thin, continuous-wave (CW) interference component 302 and a weaker, but broader, frequency shift keying (FSK) interference component 304. Accordingly, as the CW interference component 302 may be more cleanly removed, and as its removal from the input signal S(t) (106) may additionally eliminate other unrelated noise, the removal engine 102 may be configured such that the PLL filter 104a produces an estimation 126a of the CW interference component 302, which may be removed (128a) from the input signal, leaving a partially filtered input signal 306. Further, the PLL filter 104b may then produce an estimation 126b of the FSK interference component 304, which may be removed (128b) from the partially filtered input signal 306. In some embodiments, other known or suspected modulated interference components may sequentially be estimated (126n) removed (128n) from the resulting partially filtered input signal 308, until the output signal S'(t) (130) is achieved.

Figure 4:
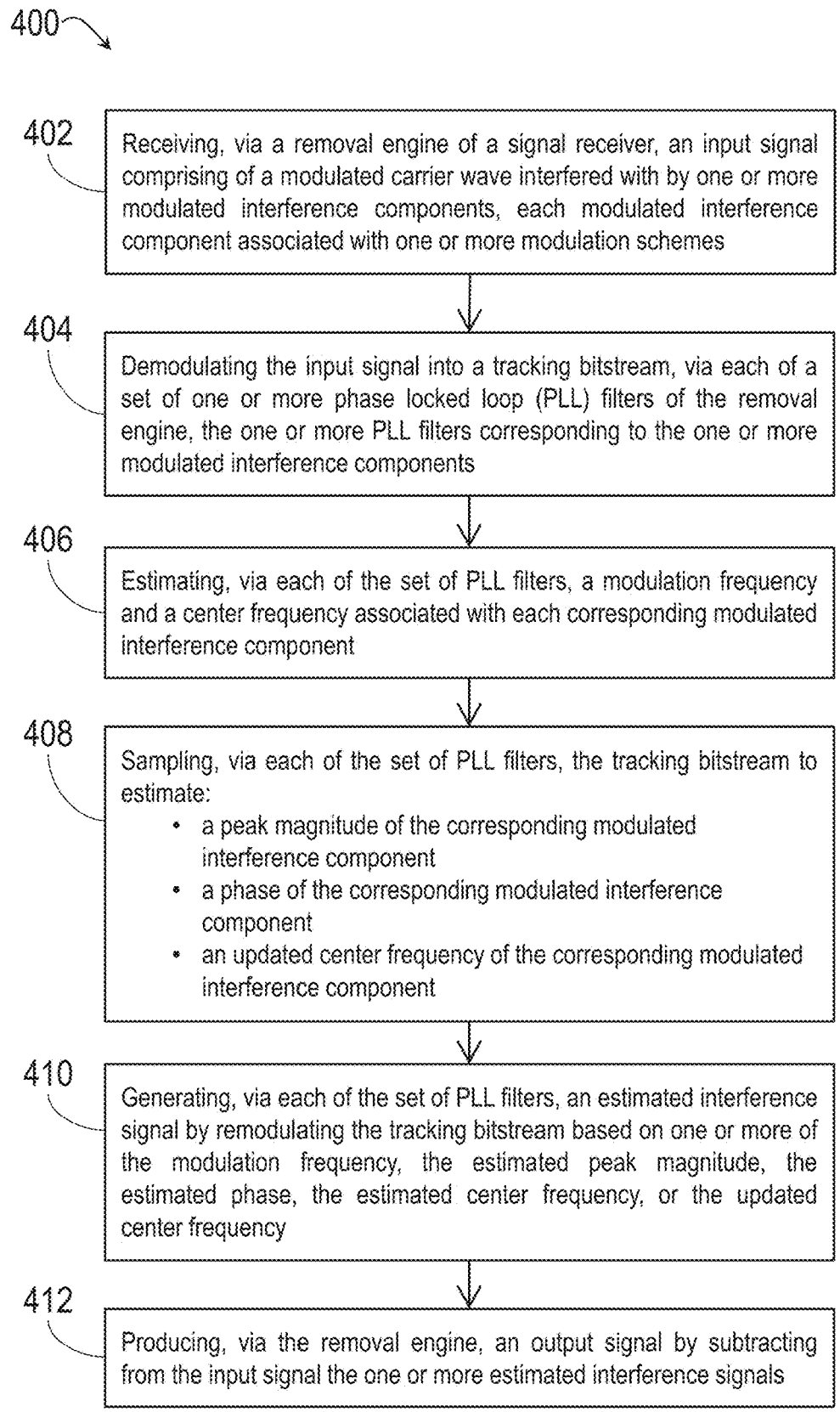
FIG. 4 is a process flow diagram illustrating a method for removal of modulated interference signals according to example embodiments of this disclosure.

Referring now to FIG. 4, the method 400 may be implemented by the signal receiver 100 and may include the following steps.

At a step 402, a removal engine of the signal receiver receives an input signal, e.g., a carrier wave interfered with by a set of modulated interference components, each component associated with a modulation scheme. For example, some modulated interference components may include one or more of: frequency shift-keying (FSK) modulated interference; minimum shift-keying (MSK) modulated interference, and/or continuous-wave (CW) modulated interference. Further, modulated interference components may include friendly signals about which a modulation frequency, and perhaps a phase center frequency, is known to the receiver.

At a step 404, a phase locked loop (PLL) filter (e.g., of a set of PLL filters, each filter dedicated to a particular target modulated interference component) demodulates the input signal into a digital tracking bitstream. For example, some or all of the set of PLL filters may be connected in parallel. In some embodiments, some of all of the set of PLL filters may be connected serially. The parallel, serial, or combined configuration of PLL filters may be determined based on what is known about the known or suspected modulated interference components, e.g., in order that certain modulated interference components be advantageously removed from the input signal prior to the removal of other modulated interference components.

At a step 406, the removal engine estimates, or selects, a modulation frequency and a starting phase center frequency for each target modulated interference component (e.g., each known or suspected modulated interference component to be removed from the input signal, corresponding to a particular PLL filter). For example, the estimated starting center frequency may be based on a spectral signature of the input signal (e.g., if said interference signal includes continuous-wave (CW) interference and/or frequency shift-keying (FSK) interference) based on pre-processing and/or analysis of the input signal. Alternatively, the selected starting center frequency may be based on known center frequency of the interference component (e.g., if said interference component includes minimum shift-keying (MSK) interference).

At a step 408, each PLL filter samples its associated tracking bitstream to estimate a peak magnitude and a phase, and, if necessary, update the estimated center frequency of the associated modulated interference component. In some embodiments, the PLL filter adjusts higher or lower from the starting center frequency in order to update the estimated center frequency to more accurately match the actual center frequency of the modulated interference component.

At a step 410, each PLL filter generates an estimate equivalent to its target modulated interference component by re-modulating the bitstream according to the modulation frequency, estimated peak magnitude, estimated phase, estimated center frequency, and/or updated center frequency.

At a step 412, the removal engine produces an output signal free of known modulation interference by subtracting from the input signal the estimated modulated interference signal generated by each PLL filter.

CONCLUSION

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:

1. A receiver system for removing modulated interference from an input signal, comprising:
a signal receiver configured for receiving an input signal comprising a modulated carrier wave interfered with by one or more modulated interference components, each modulated interference component associated with one or more modulation schemes;
and
a set of one or more phase locked loop (PLL) filters coupled to the signal receiver, each PLL filter corresponding to a modulated interference component of the one or more modulated interference components and configured to:
demodulate the input signal into a tracking bitstream;
estimate a modulation frequency and a center frequency associated with the corresponding modulated interference component;
estimate, by sampling the tracking bitstream:
a peak magnitude of the corresponding modulated interference component;
a phase of the corresponding modulated interference component;
and
an updated center frequency of the corresponding modulated interference component;
produce an estimated interference signal approximating the associated modulated interference component by re-modulating the tracking bitstream based on one or more of the modulation frequency, estimated peak magnitude, the estimated phase, the estimated center frequency, or the updated center frequency;
and
wherein the signal receiver is configured to produce an output signal by subtracting from the input signal the one or more estimated interference signals.

2. The receiver system of claim 1, wherein, with respect to at least one PLL filter of the set, the receiver system is configured to:
determine, via analysis of the input signal, a spectral signature of the input signal;
and
estimate the center frequency based on the determined spectral signature.

3. The receiver system of claim 1, wherein, with respect to at least one PLL filter of the set, the receiver system is configured to estimate the center frequency based on a known center frequency of the corresponding modulated interference component.

4. The receiver system of claim 1, wherein at least one PLL filter is configured to at least one of estimate the phase or update the center frequency by adjusting the estimated center frequency.

5. The receiver system of claim 1, wherein the one or more PLL filters are serially connected.

6. The receiver system of claim 1, wherein the one or more PLL filters are connected in parallel.

7. The receiver system of claim 1, wherein the one or more modulated interference components include at least one frequency shift keying (FSK) modulated signal.

8. The receiver system of claim 1, wherein the one or more modulated interference components include at least one minimum shift keying (MSK) modulated signal.

9. The receiver system of claim 1, wherein the one or more modulated interference components include at least one continuous wave (CW) signal.

10. A method for removal of modulated interference signals, comprising:
receiving, via a removal engine of a signal receiver, an input signal comprising of a modulated carrier wave interfered with by one or more modulated interference components, each modulated interference component associated with one or more modulation schemes;
demodulating the input signal into a tracking bitstream via each of a set of one or more phase locked loop (PLL) filters of the removal engine, the one or more PLL filters corresponding to the one or more modulated interference components;
estimating, via each of the set of PLL filters, a modulation frequency and a center frequency associated with each corresponding modulated interference component;

sampling, via each of the set of PLL filters, the tracking bitstream to estimate:
  a peak magnitude of the corresponding modulated interference component;
  a phase of the corresponding modulated interference component;
  and
  an updated center frequency of the corresponding modulated interference component;
generating, via each of the set of PLL filters, an estimated interference signal by demodulating the tracking bitstream based on one or more of the modulation frequency, the estimated peak magnitude, the estimated phase, the estimated center frequency, or the updated center frequency;
and
producing, via the removal engine, an output signal by subtracting from the input signal the one or more estimated interference signals.

11. The method of claim 10, wherein estimating, via each of the set of PLL filters, a modulation frequency and a center frequency associated with the corresponding modulated interference component includes:
  estimating the center frequency based on a known center frequency of the modulated interference component.

12. The method of claim 10, wherein estimating, via each of the set of PLL filters, a modulation frequency and a center frequency associated with the corresponding modulated interference component includes:
  estimating the center frequency based on a spectral signature of the input signal, the spectral signature determined via analysis of the input signal.

13. The method of claim 10, wherein sampling, via each of the set of PLL filters, the tracking bitstream to estimate a phase and center frequency of the corresponding modulated interference component includes:
  adjusting the determined center frequency.

14. The method of claim 10, wherein the one or more PLL filters are serially connected.

15. The method of claim 10, wherein the one or more PLL filters are connected in parallel.

16. The method of claim 10, wherein the one or more modulated interference components include at least one frequency shift keying (FSK) modulated signal.

17. The method of claim 10, wherein the one or more modulated interference components include at least one minimum shift keying (MSK) modulated signal.

18. The method of claim 10, wherein the one or more modulated interference components include at least one continuous wave (CW) modulated signal.

* * * * *